United States Patent
Davlin et al.

(10) Patent No.: US 6,680,078 B2
(45) Date of Patent: Jan. 20, 2004

(54) METHOD FOR DISPENSING FLOWABLE SUBSTANCES ON MICROELECTRONIC SUBSTRATES

(75) Inventors: John T. Davlin, Nampa, ID (US); Greg Montanino, Mountain Home, ID (US)

(73) Assignee: Micron Technology, Inc., Boise, ID (US)

( * ) Notice: Subject to any disclaimer, the term of this patent is extended or adjusted under 35 U.S.C. 154(b) by 156 days.

(21) Appl. No.: 09/904,060

(22) Filed: Jul. 11, 2001

(65) Prior Publication Data

US 2003/0012868 A1 Jan. 16, 2003

(51) Int. Cl.⁷ .................................................. B05D 3/12
(52) U.S. Cl. .......................... 427/8; 427/240; 427/425; 118/52; 118/320; 118/710; 118/713; 438/758; 438/780; 438/782
(58) Field of Search .......................... 427/8, 240, 425; 118/52, 713, 320, 710; 438/758, 780, 782

(56) References Cited

U.S. PATENT DOCUMENTS

| | | | |
|---|---|---|---|
| 5,393,624 A | * | 2/1995 | Ushijima .................... 430/30 |
| 5,843,527 A | * | 12/1998 | Sanada ...................... 427/240 |
| 5,939,130 A | * | 8/1999 | Shiraishi et al. ............... 427/9 |
| 5,985,357 A | * | 11/1999 | Sanada ......................... 427/8 |
| 6,248,175 B1 | * | 6/2001 | Subramanian et al. ...... 118/712 |
| 6,319,317 B1 | * | 11/2001 | Takamori .................... 118/52 |
| 6,383,948 B1 | * | 5/2002 | Kitano et al. ............... 438/758 |
| 2002/0176928 A1 | * | 11/2002 | Minami et al. ................ 427/8 |

* cited by examiner

Primary Examiner—Shrive P. Beck
Assistant Examiner—Kirsten Crockford Jolley
(74) Attorney, Agent, or Firm—Perkins Coie LLP

(57) ABSTRACT

A method for dispensing a flowable substance, such as a flowable photoresist, on a microelectronic substrate. The method can include dispensing a portion of the flowable substance on the microelectronic substrate, receiving an image of at least some of the flowable substance on the microelectronic substrate, and, (with reference to the image), comparing a characteristic of the image with a pre-selected characteristic, or comparing a time required to dispense the portion of the flowable substance with a pre-selected, or both. The method can further include adjusting a characteristic of the dispense process when the image differs from the pre-selected image by at least a predetermined amount, or when the time differs from the pre-selected time by at least a predetermined amount, or both.

70 Claims, 6 Drawing Sheets

METHOD FOR DISPENSING FLOWABLE SUBSTANCES ON MICROELECTRONIC SUBSTRATES

BACKGROUND

The present invention relates generally to methods for dispensing flowable substances on microelectronic substrates, for example, methods for controlling a flow of a liquid photoresist onto a semiconductor wafer. Microelectronic features are typically formed in semiconductor wafers by selectively removing material from the wafer and filling in the resulting openings with insulative, semiconductive, or conductive materials. One typical process includes depositing a layer of light-sensitive photoresist material on the wafer, then covering the photoresist layer with a patterned mask, and then exposing the masked photoresist to a selected radiation. The mask is then removed and the entire photoresist layer is exposed to a solvent. In one case, the portions of the photoresist layer exposed to the radiation through patterned openings in the mask become resistant to the solvent. Alternatively, the portions covered by the mask become resistant to the solvent. In either case, the portions of the photoresist layer remaining on the wafer after being exposed to the solvent can protect the underlying structure when the wafer is subsequently exposed to an etchant. The etchant then creates a pattern of openings (such as grooves, channels, or holes) in the wafer material or in materials deposited on the wafer. These openings can be filled with insulative, conductive, or semiconductive materials to build layers of microelectronic features on the wafer.

One conventional arrangement for depositing photoresist on a semiconductor wafer is shown in FIG. 1A. An apparatus 10 (such as a DNS SK2000, available from Dai Nippon Screen of Kyoto, Japan) includes a substrate support 11 that supports a wafer 12. A dispense nozzle 43 is positioned above the wafer 12 to dispense a liquid photoresist 33 on a central portion of the wafer 12. The wafer 12 spins (as indicated by arrow "A") to distribute the photoresist 33 over the upward facing surface of the wafer 12.

The apparatus 10 also includes a delivery system 40 that provides a regulated quantity of liquid photoresist to the dispense nozzle 43. The delivery system 40 includes a resist reservoir 41 coupled to a pump 42 to propel the photoresist to the dispense nozzle 43. A valve assembly 30 between the reservoir 41 and the dispense nozzle 43 regulates the flow of the photoresist to the dispense nozzle 43. The valve assembly 30 includes a dispense valve 31 that opens to allow the photoresist to flow to the dispense nozzle 43 and closes to prevent the flow of the photoresist. The valve assembly 30 further includes a suckback valve 32 that withdraws at least some of the liquid photoresist from the dispense nozzle 43 when the dispense valve 31 is closed, thereby reducing the likelihood for extraneous drops of photoresist to drip from the dispense nozzle 43. For example, as shown in FIG. 1B, the suckback valve 32 can operate to keep the photoresist 33 flush with the end of the dispense nozzle 43 or, (as shown in FIG. 1C) recessed from the end of the dispense nozzle 43 after the dispense valve 31 is closed. In either case, the suckback valve 32 is configured to prevent the photoresist 33 from extending beyond the end of the dispense nozzle 43 (as shown in FIG. 1D) when the dispense valve 31 is closed.

The dispense valve 31 and the suckback valve 32 are operated by air from a pressurized air supply 44. The flow of pressurized air to the valves 31 and 32 is controlled by electrically-operated solenoids 45a and 45b, respectively.

A computer-based controller 20 controls the operation of the solenoids 45a and 45b, and also controls the spin motion of the substrate support 11. Accordingly, the controller 20 includes a valve controller 23 operatively coupled to the solenoids 45a and 45b, and a spin speed controller 22 operatively coupled to a motor that rotates the substrate support 11.

The apparatus 10 can further include a video camera 21 operatively coupled to the spin speed controller 22. In operation, the video camera 21 can detect when a certain portion of the wafer 12 is covered with the photoresist 33. The speed controller 22 can then alter the speed with which the substrate support 11 spins, based on the image received from the video camera 21, to control the coverage of the photoresist 33 over the surface of the wafer 12.

One drawback with the conventional arrangement shown in FIG. 1A is that it can be difficult to accurately control the amount of photoresist 33 dispensed on the wafer 12. For example, dispensing even one additional drop of photoresist on a wafer can dramatically increase the amount of photoresist required to process a large number of wafers. Conversely, dispensing too little photoresist on the wafer can produce an ineffective photoresist layer.

One approach to addressing the foregoing drawback is to calibrate the apparatus 10. Calibration can both improve the uniformity with which a given apparatus dispenses the photoresist, and improve the consistency of results obtained from one apparatus to the next. One approach to performing the calibration is to open and close the dispense valve 131 over a period of 0.1 second while monitoring the dispense nozzle 43 by eye, and reducing the rate at which the dispense valve 131 opens if more than one drop of photoresist exits the dispense nozzle 43. The process is repeated until only a single drop exits the dispense nozzle 43. The resulting rate at which the dispense valve 131 opens is then used when dispensing the full amount of photoresist on the surface of the wafer 12.

One drawback with the foregoing approach is that it is typically not repeatable. For example, different calibration runs can produce single drops having different sizes, and the drop size can vary from one apparatus to the next. Accordingly, the existing methods for calibrating the apparatus 10 are not sufficiently accurate because they can produce photoresist layers having thicknesses that vary by up to 100 angstroms depending on which apparatus dispenses the photoresist.

SUMMARY

The present invention is directed toward methods for dispensing a flowable substance on a microelectronic substrate. In one aspect of the invention, the method can include dispensing a portion of the flowable substance on a surface of the microelectronic substrate and receiving an image of at least some of the flowable substance on the surface of the microelectronic substrate. The method can further include comparing a characteristic of the image with a pre-selected characteristic, or comparing a time required to dispense the flowable substance with a pre-selected time by reference to the image, or both comparing the image and the time. The method can still further include adjusting a characteristic of the dispense process when the image differs from the pre-selected image by a least a predetermined amount, or when the time differs from the pre-selected time by at least a predetermined amount, or both.

In another aspect of the invention, the method can further include selecting the flowable substance to include a photoresist material. Comparing the image or the time and adjusting a characteristic of the dispense process can be performed by digital computer. Adjusting a characteristic of the dispense process can include adjusting a rate at which a valve, positioned along a flow path of the flowable substance, changes from a closed state to an open state.

In still a further aspect of the invention, the method can include receiving an image of a field that includes at least some of the flowable substance on the surface of the microelectronic substrate. Based on the image, the method can further include determining an elapsed time between a first point in time and a second point in time, the second point in time corresponding to a point at which a selected fraction of the field is at least approximately covered with the flowable substance. The method can further include determining an error value between the elapsed time and a target elapsed time and adjusting a characteristic of a manner in which the flowable substance is directed toward the microelectronic substrate when the error value exceeds a target error value by a pre-selected amount. For example, the method can, include determining an elapsed time from when a dispense valve is directed to change from a closed state to an open state, to a time at which about 20% of the image field is covered with the flowable substance. The target time can be about 0.4 seconds, and the target error value for the time can be about 0.01 second.

DETAILED DESCRIPTION

The present disclosure describes methods for dispensing a flowable substance, such as a photoresist, on a microelectronic substrate. The term "microelectronic substrate" is used throughout to include substrates upon which and/or in which microelectronic circuits or components, data storage elements or layers, and/or vias or conductive lines are or can be fabricated. Many specific details of certain embodiments of the invention are set forth in the following description and FIGS. 2–5 to provide a thorough understanding of these embodiments. One skilled in the art, however, will understand the present invention may have additional embodiments, and that the invention may be practiced without several of the details described below.

Figure 1A:
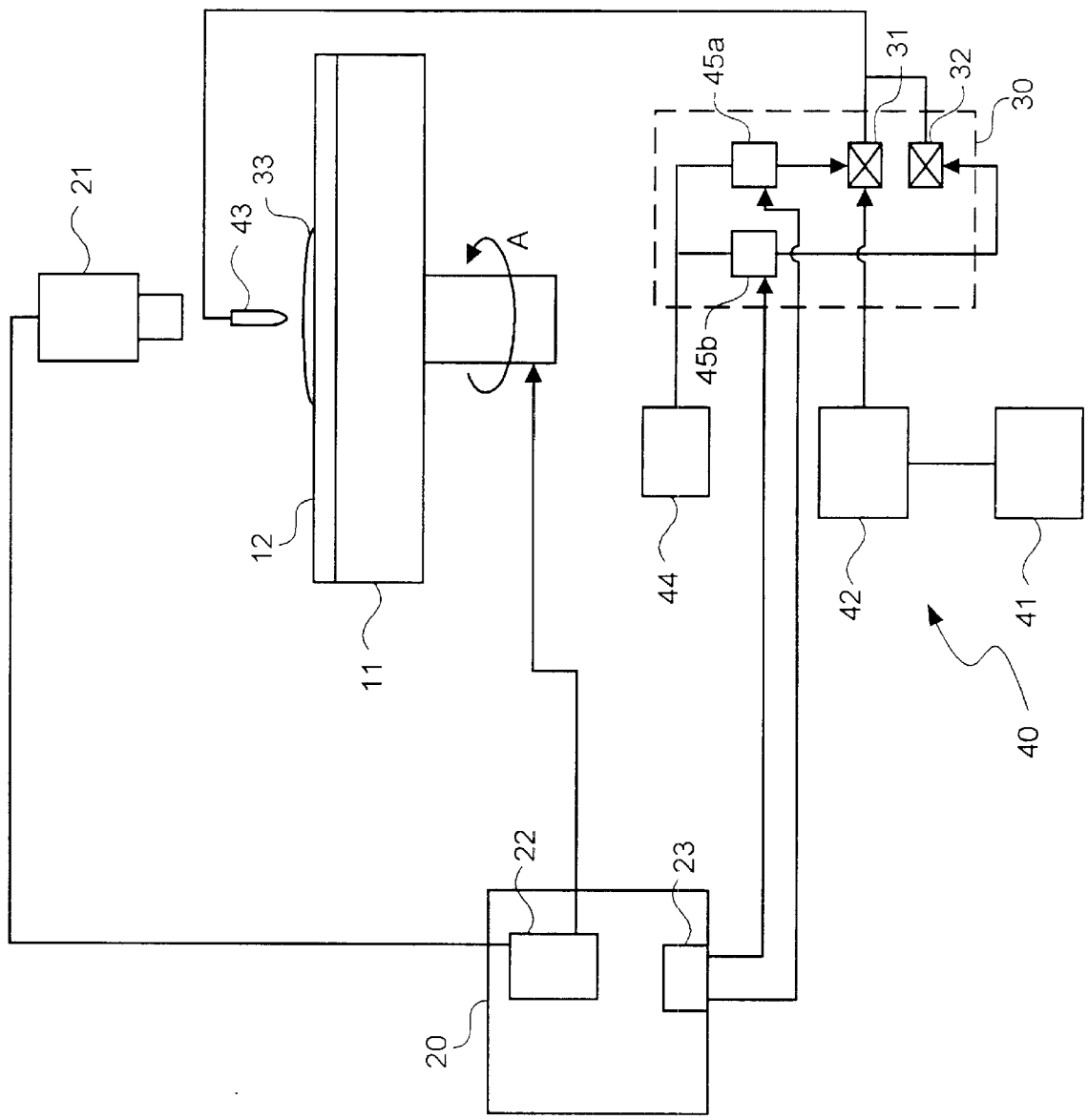
FIG. 1A illustrates a dispense apparatus in accordance with the prior art with selected components shown schematically.
Figures 1B, 1C, 1D:
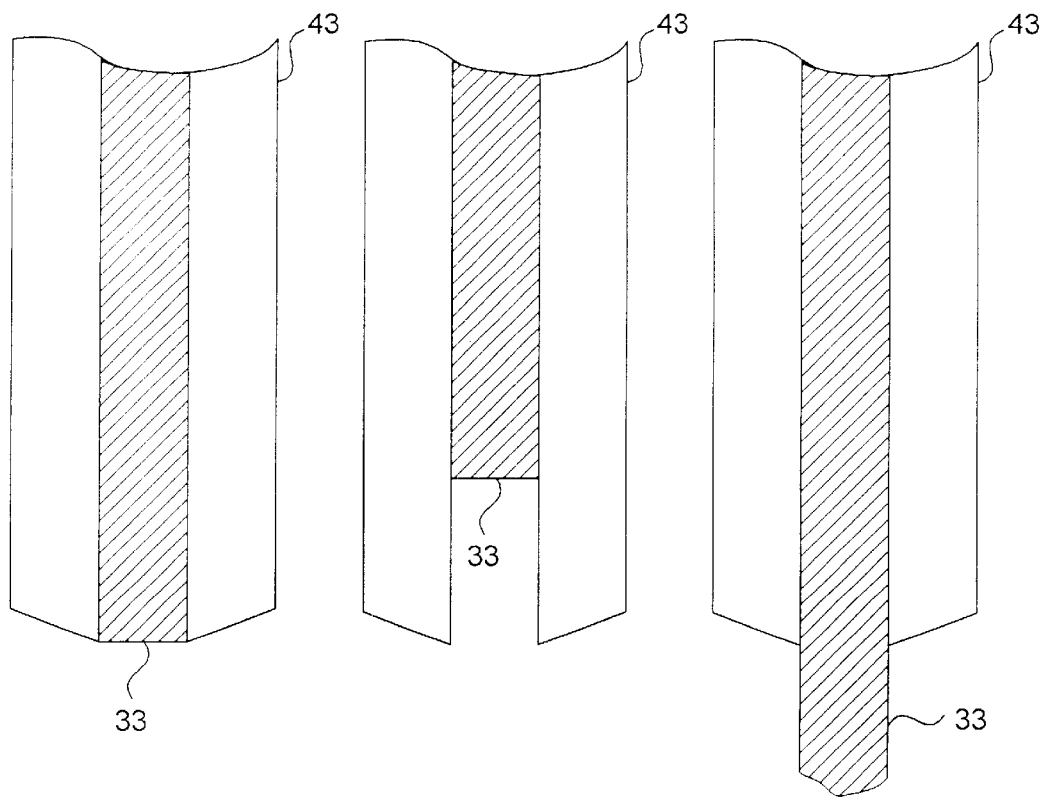
FIGS. 1B–D illustrate cross-sectional views of dispense nozzles in accordance with the prior art.
Figure 2:
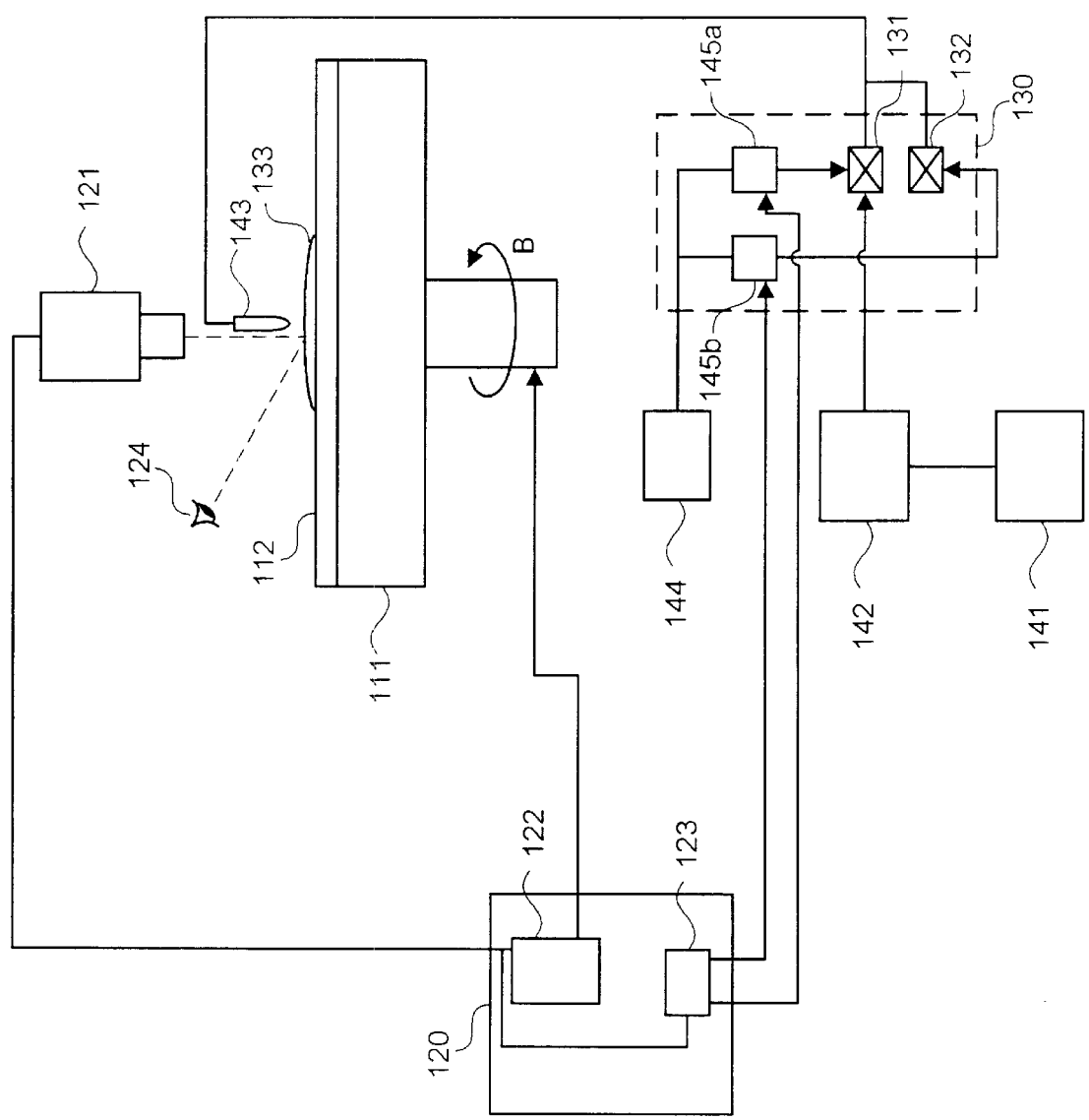
FIG. 2 is an illustration of an apparatus in accordance with an embodiment of the invention with selected components shown schematically.

FIG. 2 illustrates an apparatus 110 having a dispense monitoring system operatively coupled to flow control valves in accordance with an embodiment of the invention. In one aspect of this embodiment, the apparatus 110 can include a substrate support 111 that supports a microelectronic substrate 112 and rotates as indicated by arrow "B." A dispense nozzle 143 positioned above the microelectronic substrate 112 receives a flowable substance 133 (for example, a liquid photoresist) from a reservoir 141 and dispenses the flowable substance 133 on the microelectronic substrate 112. A pump 142 can pressurize the flowable substance 133, and a valve assembly 130, which can include a dispense valve 131 and suckback valve 132, can be positioned along a flow path between the reservoir 141 and the dispense nozzle 143 to control the flow of the flowable substance 133 toward the microelectronic substrate 112, generally as described above. In a further aspect of this embodiment, the dispense valve 131 and the suckback valve 132 can be coupled to a pressurized air supply 144 that actuates the valves via solenoids 145a and 145b, also as described above.

The apparatus 110 can also include a controller 120 (such as a digital computer) having a spin speed controller 122 to control the spin speed of the substrate support 111, and a valve controller 123 to control the operation of the valve assembly 130. An optical image generator 121, such as a video camera, can be positioned over the microelectronic substrate 112 and the substrate support 111 and can be coupled to the spin speed controller 122 to control the rate at which the substrate support 111 rotates, in a manner generally similar to that described above.

In still a further aspect of an embodiment shown in FIG. 2, the optical image generator 121 can be coupled to the valve controller 123.

Accordingly, input received from the image generator 121 can be used to control the operation of the dispense valve 131 and/or the suckback valve 132. The feedback between the image generator 121 and the dispense valve 131 and/or the suckback valve 132 can be automatically performed by the valve controller 123. Alternatively, a user can manually change characteristics of the valve assembly 130 based on input received from the image generator 121. In still a further embodiment, a viewer 124 can visually assess the dispense process (in lieu of the image generator 121 and the controller 120), and can manually adjust characteristics of the dispense valve 131 and/or the suckback valve 132. Further details of these embodiments are discussed below.

Figure 3:
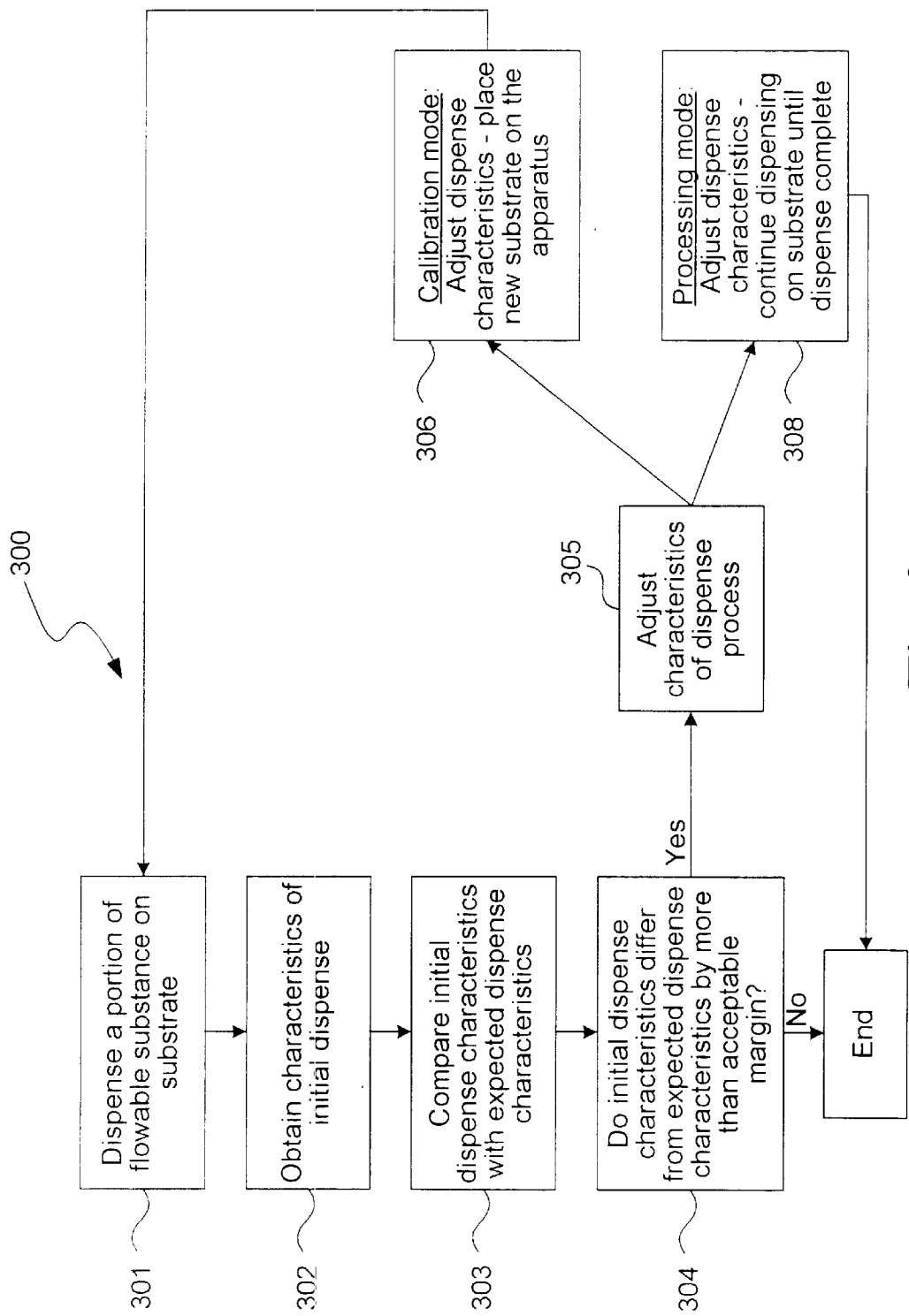
FIG. 3 is a flow diagram illustrating a method in accordance with an embodiment of the invention.
Figure 4:
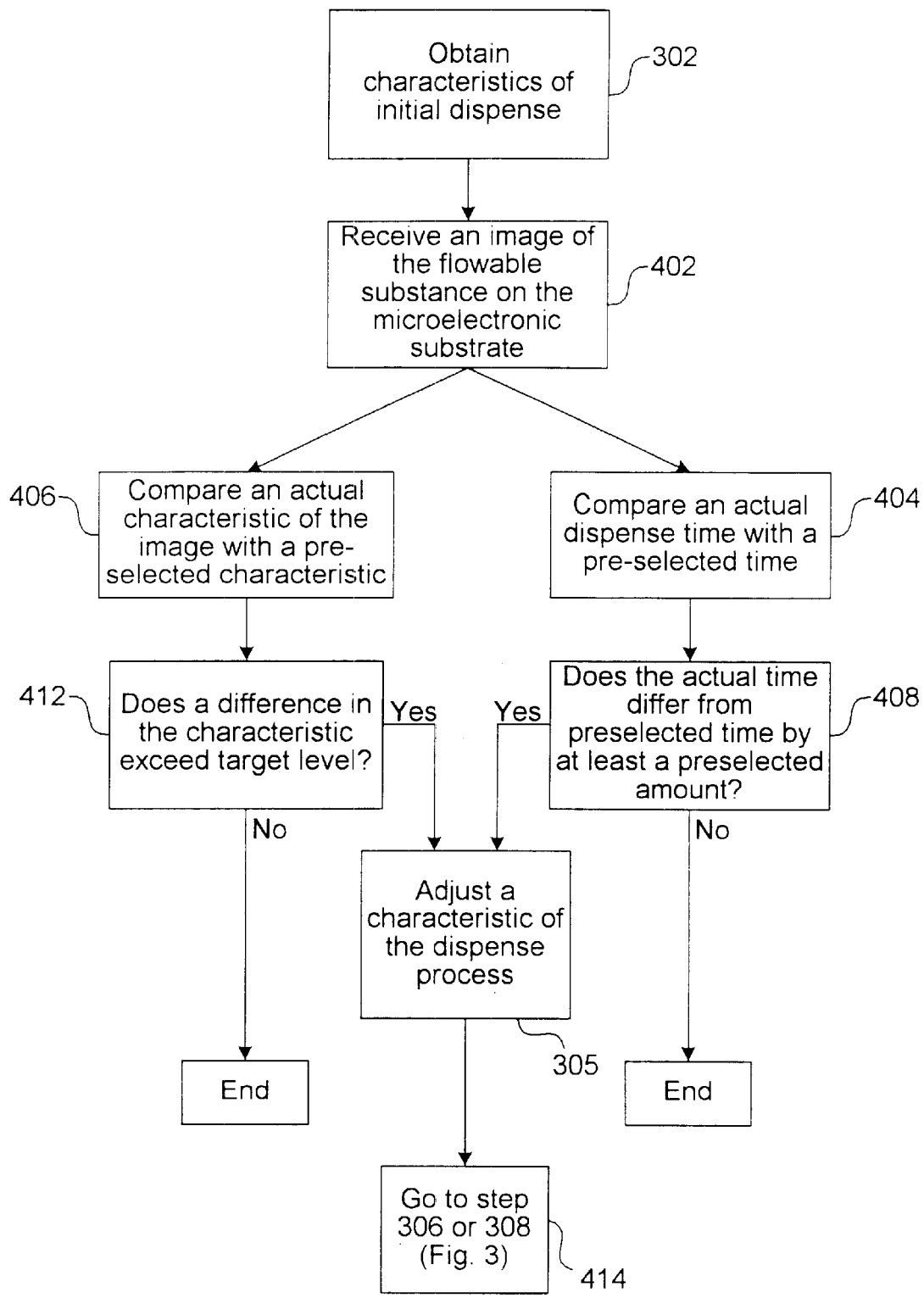
FIG. 4 is a flow diagram illustrating a method in accordance with another embodiment of the invention.
Figure 5:
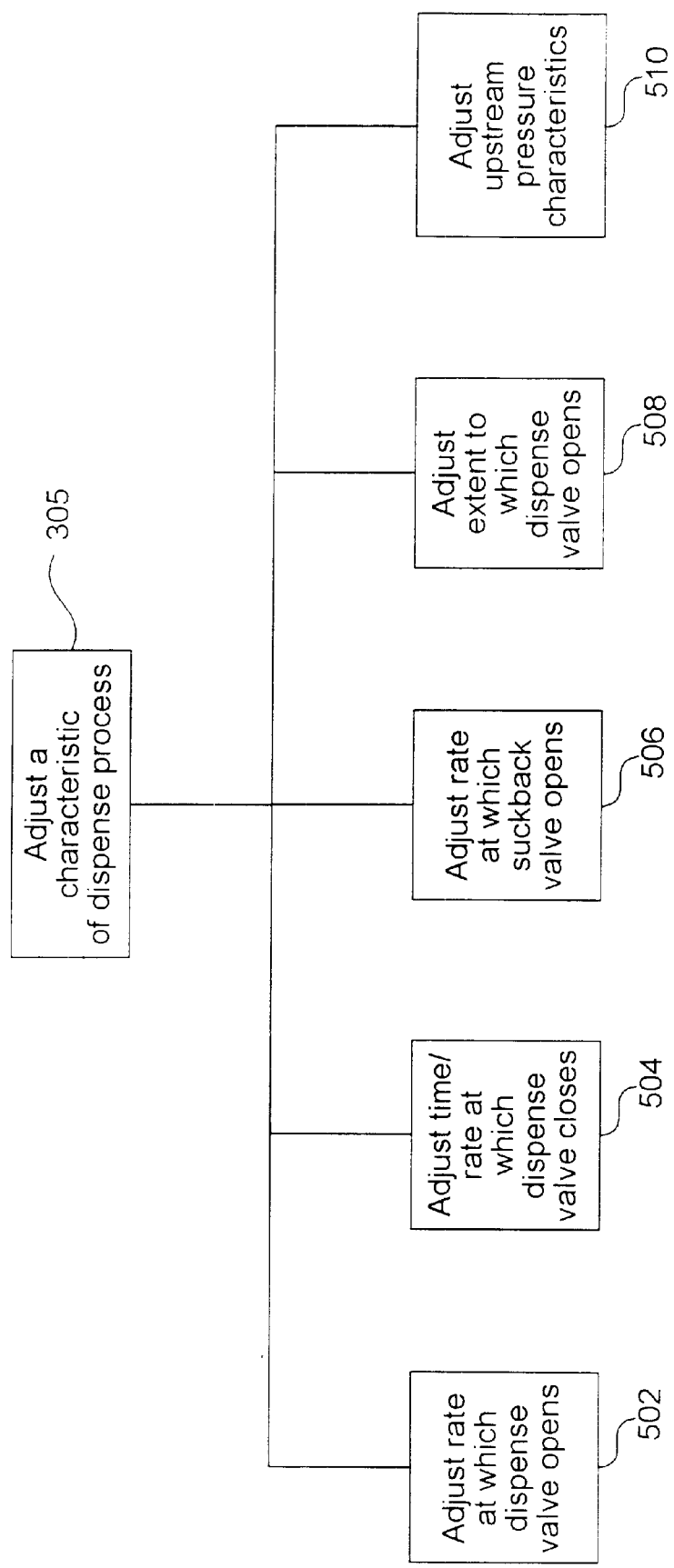
FIG. 5 is a flow diagram illustrating methods for adjusting characteristics of a dispense process in accordance with embodiments of the invention.

FIGS. 3–5 are flow diagrams illustrating a process 300 for controlling the manner in which the flowable substance 133 is dispensed on a microelectronic substrate with an embodiment of the apparatus 110 described above with reference to FIG. 2. Beginning with FIG. 3, the process 300 can include dispensing a portion of the flowable substance 133 on the microelectronic substrate (step 301) and obtaining characteristics of the initial dispense process (step 302), such as how much flowable substance 133 is dispensed or how quickly it is dispensed. In step 303, the initial dispense characteristics are compared with one or more expected dispense characteristics. The process can further include determining whether the initial dispense characteristics differ from the expected dispense characteristics by more than an acceptable margin (step 304). If the initial dispense characteristics are within acceptable limits, the process is complete. If the initial dispense characteristics are outside acceptable limits, then characteristics of the dispense process are adjusted in step 305.

The adjustment process can be completed in a calibration mode (step 306) or a processing mode (step 308). In the calibration mode, characteristics of the dispense process (such as the manner with which the valve assembly 130 operates) are adjusted and a new microelectronic substrate is placed on the apparatus 110. Steps 301–304 are then repeated until the dispense characteristics fall within acceptable limits. In the processing mode, characteristics of the dispense process are adjusted while the initial microelectronic substrate remains on the apparatus 110. An additional amount of the flowable substance 133 is then dispensed on the microelectronic substrate until the dispense process is complete. Further details of each mode are described below with reference to FIGS. 4 and 5.

Referring now to FIG. 4, the step of obtaining characteristics of the initial dispense process (step 301) can include receiving an image of the flowable substance on the microelectronic substrate (step 402). In one embodiment, the image is received directly by the viewer 124. In another embodiment, the image is generated by the image generator 121 and received by the controller 120.

Accordingly, the controller 120 can be configured to receive a machine-readable image of the flowable substance 133 on the surface of the microelectronic substrate 112. In a further aspect of this embodiment, the image can be of a 2 cm. by 2 cm. square field centered on or near the center of the microelectronic substrate 112. In other embodiments, the image can be of fields having other sizes or shapes, and/or can be positioned over other regions of the microelectronic substrate 112. In any of the above embodiments, the method can further include processing the image by comparing an actual dispense time (determined with reference to the image) to a pre-selected or target dispense time (step 404) and/or comparing an actual characteristic of the image to a pre-selected or target characteristic (step 406). Steps 404 and 406 are described in greater detail below.

In one embodiment, the process of comparing the actual dispense time with a pre-selected dispense time (step 404) can include comparing the time required to dispense the flowable substance over a fraction of the image field with a target time for covering the same fraction of the field. If the actual time differs from the target time by at least a pre-selected amount (step 408), then the characteristics of the dispense process are adjusted (step 305). If the actual time is within acceptable limits, the process can end.

In one specific embodiment, it has been determined that a selected photoresist solution should flow for about 1.7 seconds to achieve uniform coverage over a 200 mm. diameter microelectronic substrate 112 under selected conditions. The 1.7 second time interval is measured from the time an "open" signal is transmitted to the dispense valve 131, to the time a "close" signal is transmitted to the dispense valve 131. It has further been determined that if 20% of the 2 cm. by 2 cm. field described above is covered after an elapsed time of 0.4 second, the photoresist can be dispensed for an additional 1.3 seconds to uniformly cover the microelectronic substrate 112. Accordingly, in one embodiment, the process can include determining when 20% of the image field is covered with photoresist, comparing this value with a 0.4 second target value, and adjusting characteristics of the dispense process if the difference between the actual time and the target time exceed a pre-selected amount. In a further aspect of this embodiment, the pre-selected amount can have a value of about 0.01 second, so that if the actual time to cover 20% of the 2 cm. by 2 cm. field is outside the range of 0.39–0.41 second, characteristics of the dispense process can be changed to improve the dispense time.

In one embodiment, the image generator 121 can generate an image on an array of pixels or other discrete image elements, and the controller 120 can determine when a pre-selected fraction of the pixels indicate coverage by the flowable substance 133. For example, the controller 120 can detect a change in contrast between pixels depicting a region of the microelectronic substrate 112 covered by the flowable substance 133, and pixels depicting an uncovered region of the microelectronic substrate 112. Alternatively, the image generator 121 can determine when the pre-selected fraction of the image field is covered. The fraction of the image field can be about 20%, as described above, or alternatively, the fraction can have other values. In further embodiments, for example, when the total dispense time has a value significantly greater than 1.7 seconds, the viewer 124 (rather than the image generator 121 and the controller 120) can determine when a target fraction of the surface of the microelectronic substrate 112 is covered with the flowable substance. For example, in one embodiment, the flowable substance 133 can include a polyimide or other relatively viscous substance that moves slowly enough over the surface of the microelectronic substrate 112 to be accurately timed by the viewer 124.

In any of the embodiments described above, the actual dispense time can be determined by subtracting the time at which the dispense process is initiated ($t_0$) from the time at which the selected fraction of the image field is covered ($t_1$). The value of $t_0$ can be measured at the time an instruction is delivered from the controller 120 to the solenoid 145a to open the dispense valve 131. In other embodiments, $t_0$ can have other values. For example, $t_0$ can be measured when the dispense valve 131 actually begins to open.

In another embodiment, also shown in FIG. 4, the process can include comparing actual characteristics of the image received in step 402 against pre-selected characteristics (step 406), instead of (or in addition to) comparing the actual dispense time with a target dispense time. For example, the process can include determining how much of the image field is covered with the flowable substance 133 at the end of a selected time period (such as a 0.40 second period). If the amount of the field covered at the end of the fixed period differs from an expected amount of coverage by more than a selected amount (step 412), the characteristics of the dispense process can be adjusted (step 305). For example, if after 0.4 second, more than or less than 20% of the image field is covered with the flowable substance 133, the characteristics of the dispense process can be adjusted. After the characteristics of the dispense process have been adjusted (as described in greater detail below with reference to FIG. 5), the method can continue at step 414 by returning to step 306 if the method is used in a calibration mode, or returning to step 308 if the method is used in a processing mode.

FIG. 5 illustrates several steps that can be completed to adjust the characteristics of the dispense process. The effectiveness of each of the steps described below with reference to FIG. 5 may depend upon whether the step is used in the calibration mode or the processing mode, whether the step is performed manually or automatically, and/or the length of time required for the overall dispense process.

In step 502, the method can include adjusting a rate at which the dispense valve 131 opens. For example, if in step 408 or step 412 it is determined that the actual dispense rate is below the target dispense rate, the rate at which the dispense valve 131 opens can be increased. If it is determined in step 408 or step 412 that the dispense rate exceeds the target dispense rate, the rate at which the dispense valve 131 opens can be decreased.

In step 504, the method can include adjusting a time at which the dispense valve 131 closes, and/or a rate at which the dispense valve 131 closes. For example, if the actual dispense rate lags the target dispense rate, the dispense valve 131 can be left open for a greater period of time and/or the rate at which the dispense valve 131 closes can be decreased. Alternatively, if the actual dispense rate exceeds the target dispense rate, the dispense valve 131 can be closed earlier and/or more quickly.

In step 506, the rate at which the suckback valve 132 opens can be increased. For example, if the actual dispense rate is greater than the target dispense rate, the rate at which the suckback valve 132 opens can be increased. Alternatively, if the actual dispense rate is less than the target dispense rate, the rate at which the suckback valve 132 opens can be decreased. In a further aspect of this embodiment, the operation of the suckback valve 132 can be tied to the operation of the dispense valve 131, so that when the dispense valve 131 opens, the suckback valve 132 closes and vice versa. The rates at which one valve opens and/or closes can be independent of, or alternatively, coupled to the rate at which the other valve opens and/or closes.

In step 508, the method can include adjusting an extent to which the dispense valve 131 opens. For example, when the dispense valve 131 is configured to remain open at any of several flow area settings (rather than alternate between a single fully open setting and a single fully closed setting), the method can include selecting an initial fully open setting. If the actual dispense rate exceeds the target dispense rate at the initial setting, the fully open position of the dispense valve 131 can be decreased (in the calibration mode), or the dispense valve 131 can be partially closed (in the processing mode). Alternatively, if the dispense rate is less than the target dispense rate, the fully open flow area of the dispense valve 131 can be increased.

In step 510, the process can include adjusting characteristics of the pressure generated upstream of the valve assembly 130. For example, in one embodiment, the pump 142 starts and stops depending upon the need for flow at the dispense nozzle 143. In a further aspect of this embodiment, the pump 142 begins operating slightly before the dispense valve 131 opens. Accordingly, in one aspect of this embodiment, the pump 142 can increase the pressure built up prior to the dispense valve 131 opening by starting up earlier (for example, if the actual dispense rate lags the target dispense rate). Alternatively, if the actual dispense rate exceeds the target dispense rate, the pump 142 can be started closer to the time at which the dispense valve 131 opens.

In any of the embodiments described above, the characteristics of the dispense process can be adjusted manually or automatically. For example, in one embodiment, the apparatus 110 shown in FIG. 2 can include a manually controllable knob that regulates how quickly the dispense valve 131 opens. Accordingly, if the dispense rate lags the target dispense rate, the user can manually increase the rate at which the dispense valve 131 opens by adjusting the knob. Alternatively, changes made to the rate at which the dispense valve 131 opens can be automatic, for example, when the dispense valve 131 includes a digitally controlled valve. In one embodiment, when the controller 120 determines that the actual dispense rate lags the target dispense rate, it can automatically increase the rate at which the dispense valve 131 opens by sending the appropriate electrical signal to the valve assembly 130. In a similar manner, the remaining processes described above with reference to FIG. 5 can be performed either manually by the user or automatically by the controller 120.

One feature of an embodiment of the method described above with reference to FIGS. 2–5 is that the image receiver (the viewer 124 or the controller 120) can be operatively linked to the valve assembly 130. Accordingly, characteristics of the dispense process can be adjusted to conform the process with target levels. An advantage of this feature is that the amount of a flowable substance 133 (such as a liquid photoresist) dispensed on a microelectronic substrate 112 can be more accurately controlled. For example, in one embodiment, the variation in average photoresist layer thickness for 100 microelectronic substrates on the same apparatus was found to be less than 10 angstroms. The variation in average photoresist layer thickness from one apparatus 110 to another was found to be less than 15 angstroms, and the variation in photoresist thickness across any one microelectronic substrate 112 was also found to vary by less than 15 angstroms. Accordingly, the method can provide more uniform and consistent results than conventional methods.

From the foregoing, it will be appreciated that specific embodiments of the invention have been described herein for purposes of illustration, but that various modifications may be made without deviating from the spirit and the scope of the invention. Accordingly, the invention is not limited except as by the appended claims.

What is claimed is:

1. A method for dispensing a flowable substance on a microelectronic substrate, comprising:

initiating a flow of the flowable substance toward a surface of the microelectronic substrate;

dispensing a portion of the flowable substance on the surface of the microelectronic substrate;

receiving an image of a field that includes at least some of the flowable substance on the surface of the microelectronic substrate;

based on the image, determining an elapsed time between a first point in time and a second point in time, the second point in time corresponding to a point at which a selected fraction of the field is covered with the flowable substance;

determining an error value between the elapsed time and a target elapsed time; and adjusting a characteristic of a manner in which the flowable substance is directed toward the microelectronic substrate when the error value exceeds a target error value by a pre-selected amount.

2. The method of claim 1, further comprising selecting the flowable substance to include a photoresist material, and wherein determining an error value and adjusting a characteristic are performed by a digital computer, further wherein a valve is positioned along a flow path of the flowable substance between a source of the flowable substance and the microelectronic substrate, the valve having an open state and a closed state, further wherein adjusting a characteristic includes adjusting a rate at which the valve changes from the closed state to the open state.

3. The method of claim 1, further comprising selecting the flowable substance to include a photoresist material, and wherein receiving an image includes receiving a video image, further wherein determining an error value and adjusting a characteristic are performed by a digital computer, and wherein a valve is positioned along a flow path of the flowable substance between a source of the flowable substance and the microelectronic substrate, the valve having an open state and a closed state, still further wherein adjusting a characteristic includes adjusting a rate at which the valve changes from the closed state to the open state.

4. The method of claim 1 wherein a valve is positioned along a flow path of the flowable substance between a source of the flowable substance and the microelectronic substrate, the valve having an open state and a closed state, and wherein initiating the flow of the flowable substance includes transmitting a signal from a digital computer to the valve to change the valve from the closed state to the open state.

5. The method of claim 1 wherein a valve is positioned along a flow path of the flowable substance between a source of the flowable substance and the microelectronic substrate, the valve having an open state and a closed state, and wherein initiating the flow of flowable substance includes transmitting a signal to the valve to change from the closed state to the open state.

6. The method of claim 1 wherein a valve is positioned along a flow path of the flowable substance between a source of the flowable substance and the microelectronic substrate, the valve having an open state and a closed state, and wherein the method further comprises selecting the first point in time to correspond to a time at which a signal is transmitted to the valve, the signal causing the valve to change from the closed state to the open state.

7. The method of claim 1 wherein a valve is positioned along a flow path of the flowable substance between a source of the flowable substance and the microelectronic substrate, the valve having an open state and a closed state, and wherein initiating the flow includes transmitting an electrical signal to a solenoid to move the solenoid, with the movement of the solenoid changing a flow of air operatively coupled to a portion of a valve that changes from a closed position to an open position.

8. The method of claim 1 wherein initiating the flow toward the microelectronic substrate includes initiating the flow along a fluid path that leads toward the microelectronic substrate.

9. The method of claim 1 wherein a valve is positioned along a flow path of the flowable substance between a source of the flowable substance and the microelectronic substrate, the valve having an open state and a closed state, and wherein adjusting a characteristic includes manually adjusting a rate at which the valve changes to the open state.

10. The method of claim 1 wherein a digitally controlled valve is positioned along a flow path of the flowable substance between a source of the flowable substance and the microelectronic substrate, the valve having an open state and a closed state, and wherein adjusting a characteristic includes automatically adjusting a rate at which the valve changes to the open state.

11. The method of claim 1 wherein adjusting a characteristic includes adjusting a characteristic when the error value exceeds a target error value of approximately 0.4 second.

12. The method of claim 1 wherein adjusting a characteristic includes adjusting a characteristic when the error value exceeds a target error value of about 0.01 second.

13. The method of claim 1 wherein the microelectronic substrate is a first microelectronic substrate and adjusting a characteristic is performed after dispensing the flowable substance on the first microelectronic substrate and before dispensing the flowable substance on a second microelectronic substrate.

14. The method of claim 1 wherein adjusting a characteristic is performed while dispensing the flowable substance on the microelectronic substrate.

15. The method of claim 1 wherein a valve is positioned along a flow path of the flowable substance between a source of the flowable substance and the microelectronic substrate, the valve having an open state and a closed state, and wherein adjusting a characteristic includes adjusting a rate at which the valve moves from the closed state to the open state.

16. The method of claim 1 wherein a fluid path between a source of the flowable substance and the microelectronic substrate includes a valve configured to selectively reverse movement of the flowable substance toward the microelectronic substrate, and wherein adjusting a characteristic includes adjusting a rate at which the valve reverses the movement of the flowable substance.

17. The method of claim 1 wherein adjusting a characteristic includes adjusting a pressure at which the flowable substance is directed along a fluid path toward the microelectronic substrate.

18. The method of claim 1 wherein a valve is positioned along a flow path of the flowable substance between a source of the flowable substance and the microelectronic substrate, the valve having an open state and a closed state, and wherein adjusting a characteristic includes adjusting a flow area of the valve in the open state.

19. The method of claim 1 wherein a valve is positioned along a flow path of the flowable substance between a source of the flowable substance and the microelectronic substrate, the valve having an open state and a closed state, and wherein a pump is positioned in fluid communication with the flow path, still further wherein adjusting a characteristic includes adjusting a length of time between activating the pump and opening the valve by increasing the length of time when the elapsed time is greater than the target time and decreasing the length of time when the elapsed time is less than the target time.

20. The method of claim 1 wherein determining an elapsed time includes determining an elapsed time between the first time and a time when about 20% of the field is covered with the flowable substance.

21. The method of claim 1 wherein the microelectronic substrate is one of a plurality of microelectronic substrates, and wherein the method further includes disposing the flowable substance on the plurality of microelectronic substrates to an average thickness that varies by less than about ten angstroms from one substrate to another.

22. The method of claim 1 wherein dispensing includes dispensing the flowable substance on the microelectronic substrate to a thickness that varies by less than about 15 angstroms over the surface of the microelectronic substrate.

23. The method of claim 1 wherein initiating, dispensing, receiving, determining, and adjusting are performed with a first apparatus on a first microelectronic substrate, and wherein the method further includes performing these processes with a plurality of apparatuses on a corresponding plurality of microelectronic substrates to form a corresponding plurality of photoresist layers having an average thickness that varies by less than about 15 angstroms for layers formed on one apparatus to layers formed on the next apparatus.

24. The method of claim 1, further comprising selecting the flowable substance to include a photoresist material.

25. The method of claim 1 wherein the portion of the flowable substance is a first portion, and wherein the method further comprises disposing a second portion of the flowable substance on the microelectronic substrate to at least approximately cover the surface of the microelectronic substrate.

26. The method of claim 1, further comprising selecting the field to cover about four square centimeters of a surface area of one surface of the microelectronic substrate.

27. The method of claim 1 wherein receiving an image includes receiving a video image, and wherein the method further comprises generating the video image.

28. The method of claim 1 wherein receiving an image includes receiving a machine readable image, and wherein the method further comprises generating the machine-readable image.

29. The method of claim 1 wherein receiving an image includes a user receiving the image.

30. The method of claim 1 wherein determining an elapsed time and determining an error value are performed by a digital computer.

31. A method for disposing a flowable substance on a microelectronic substrate, comprising:
 initiating a flow of the flowable substance toward a surface of the microelectronic substrate;
 dispensing a portion of the flowable substance on the surface of the microelectronic substrate;
 receiving an image of a field that includes at least some of the flowable substance on the surface of the microelectronic substrate;
 comparing a first value corresponding to a portion of the image fully covered by the flowable substance with a pre-selected second value; and
 adjusting a characteristic of a manner in which the flowable substance is directed toward the microelectronic substrate when a difference between the first value and the second value exceeds a target level.

32. The method of claim 31 wherein comparing a first value includes comparing a first value corresponding to an amount of the field covered with the flowable substance to a target amount.

33. The method of claim 31 wherein adjusting a characteristic includes adjusting a characteristic when an amount of the field covered with the flowable substance differs from a target amount by at least a pre-selected amount.

34. The method of claim 31 wherein comparing a first value includes comparing the first value with a second value corresponding to about 20% of the field covered with the flowable substance.

35. The method of claim 31, further comprising selecting the flowable substance to include a photoresist material, and wherein comparing a first value with a second value and adjusting a characteristic of a manner in which the flowable substance is directed toward the microelectronic substrate are performed by a digital computer, and wherein a valve is positioned along a flow path of the flowable substance between a source of the flowable substance and the microelectronic substrate, the valve having an open state and a closed state, further wherein adjusting a characteristic includes adjusting a rate at which the valve changes from the closed state to the open state.

36. The method of claim 31, further comprising selecting the flowable substance to include a photoresist material, and wherein receiving an image includes receiving a video image, and wherein comparing a first value with a second value and adjusting a characteristic of a manner in which the flowable substance is directed toward the microelectronic substrate are performed by a digital computer, and wherein a valve is positioned along a flow path of the flowable substance between a source of the flowable substance and the microelectronic substrate, the valve having an open state and a closed state, further wherein adjusting a characteristic includes adjusting a rate at which the valve changes from the closed state to the open state.

37. The method of claim 31 wherein a valve is positioned along a flow path of the flowable substance between a source of the flowable substance and the microelectronic substrate, the valve having an open state and a closed state, and wherein initiating the flow of flowable substance includes transmitting a signal to the valve to change from the closed state to the open state.

38. The method of claim 31 wherein receiving an image of a field that includes at least some of the flowable substance includes a user receiving the image.

39. The method of claim 31 wherein initiating the flow toward the microelectronic substrate includes initiating the flow along a fluid path that leads toward the microelectronic substrate.

40. The method of claim 31 wherein a valve is positioned along a flow path of the flowable substance between a source of the flowable substance and the microelectronic substrate, the valve having an open state and a closed state, and wherein adjusting a characteristic includes manually adjusting a rate at which the valve changes to the open state.

41. The method of claim 31 wherein a digitally controlled valve is positioned along a flow path of the flowable substance between a source of the flowable substance and the microelectronic substrate, the valve having an open state and a closed state, and wherein adjusting a characteristic includes automatically adjusting a rate at which the valve changes to the open state.

42. The method of claim 31 wherein the microelectronic substrate microelectronic substrate and adjusting a characteristic is performed after dispensing the flowable substance on the first microelectronic substrate and before dispensing the flowable substance on a second microelectronic substrate.

43. The method of claim 31 wherein adjusting a characteristic is performed while dispensing the flowable substance on the microelectronic substrate.

44. The method of claim 31 wherein initiating, dispensing, receiving, comparing, and adjusting are performed with a first apparatus on a first microelectronic substrate, and wherein the method further includes performing these processes with a plurality of apparatuses on a corresponding plurality of microelectronic substrates to form a corresponding plurality of photoresist layers having an average thickness that varies by less than about 15 angstroms for layers formed on one apparatus to layers formed on the next apparatus.

45. The method of claim 31, further comprising selecting the flowable substance to include a photoresist material.

46. The method of claim 31 wherein generating an image includes receiving a video image, and wherein the method further includes generating the video image.

47. The method of claim 31 wherein receiving an image includes receiving a machine readable image, and wherein the method further includes generating the machine-readable image.

48. A method for disposing a flowable substance on a microelectronic substrate, comprising:
 dispensing a portion of the flowable substance on a surface of the microelectronic substrate;
 receiving an image of at least some of the flowable substance on the surface of the microelectronic substrate;
 comparing a first value corresponding to a portion of the image fully covered by the flowable substance with a pre-selected second value, or comparing a time required to dispense the portion of the flowable substance with a pre-selected time by reference to the image, or both comparing the image and the time; and
 adjusting a characteristic of the dispense process when the first value differs from the second value by at least a pre-determined amount, or when the time differs from the pre-selected time by at least a pre-determined amount, or both.

49. The method of claim 48, further comprising selecting the flowable substance to include a photoresist material, and wherein comparing the first value or the time and adjusting a characteristic are performed by a digital computer, and wherein a valve is positioned along a flow path of the flowable substance between a source of the flowable substance and the microelectronic substrate, the valve having an open state and a closed state, further wherein adjusting a characteristic includes adjusting a rate at which the valve changes from the closed state to the open state.

50. The method of claim 48 wherein initiating the flow toward the microelectronic substrate includes initiating the flow along a fluid path that leads toward the microelectronic substrate.

51. The method of claim 48 wherein the portion of the flowable substance is a first portion, and wherein the method further comprises disposing a second portion of the flowable substance on the microelectronic substrate to cover the surface of the microelectronic substrate.

52. The method of claim 48 wherein comparing a first value includes comparing the first value with a second value corresponding to about 20% of the field covered with the flowable substance.

53. The method of claim 48 wherein the microelectronic substrate is a first microelectronic substrate and adjusting a characteristic is performed after dispensing the flowable substance on the first microelectronic substrate and before dispensing the flowable substance on a second microelectronic substrate.

54. The method of claim 48 wherein adjusting a characteristic includes adjusting a rate at which a valve in a fluid path between a source of the photoresist and the microelectronic substrate opens.

55. The method of claim 48 wherein adjusting a characteristic includes adjusting a pressure with which the flowable substance is directed along a fluid path toward the microelectronic substrate.

56. The method of claim 48, further comprising selecting the flowable substance to include a photoresist material.

57. The method of claim 48 wherein a valve is positioned along a flow path of the flowable substance between a source of the flowable substance and the microelectronic substrate, the valve having an open state and a closed state, and wherein dispensing a portion of the flowable substance includes transmitting a signal to the valve to change from the closed state to the open state.

58. A method for controlling a thickness of a layer of flowable substance on a microelectronic substrate, comprising:

disposing a portion of the flowable substance on a surface of the microelectronic substrate;

determining whether the flowable substance is disposed at a target rate by comparing a machine-generated image of the amount of flowable substance disposed on the microelectronic substrate to a target amount of flowable substance, or comparing a period of time taken to cover a selected field of view with flowable substance to a target period of time, or both; and adjusting a characteristic of a manner in which the flowable substance is disposed on the surface of the microelectronic substrate when an actual rate at which the flowable substance is disposed differs from the target rate by at least a selected amount.

59. The method of claim 58 wherein comparing the image or the period of time and adjusting a characteristic are performed by a digital computer, and wherein a valve is positioned along a flow path of the flowable substance between a source of the flowable substance and the microelectronic substrate, the valve having an open state and a closed state, further wherein adjusting a characteristic includes adjusting a rate at which the valve changes from the closed state to the open state.

60. The method of claim 58 wherein initiating the flow toward the microelectronic substrate includes initiating the flow along a fluid path that leads toward the microelectronic substrate.

61. The method of claim 58 wherein the portion of the flowable substance is a first portion, and wherein the method further comprises disposing a second portion of the flowable substance on the microelectronic substrate to cover the surface of the microelectronic substrate.

62. The method of claim 58 wherein comparing an image includes comparing the image with an image having about 20% of the field covered with the flowable substance.

63. The method of claim 58 wherein the microelectronic substrate is a first microelectronic substrate and adjusting a characteristic is performed after dispensing the flowable substance on the first microelectronic substrate and before dispensing the flowable substance on a second microelectronic substrate.

64. The method of claim 58 wherein adjusting a characteristic includes adjusting a rate at which a valve in a fluid path between a source of the flowable substance and the microelectronic substrate opens.

65. The method of claim 58 wherein adjusting a characteristic includes adjusting a pressure with which the flowable substance is directed along a fluid path toward the microelectronic substrate.

66. The method of claim 58 wherein a valve is positioned along a flow path of the flowable substance between a source of the flowable substance and the microelectronic substrate, the valve having an open state and a closed state, and wherein disposing the flowable substance includes transmitting a signal to the valve to change from the closed state to the open state.

67. A method for controlling a thickness of a layer of liquid photoresist disposed on a surface of a microelectronic substrate, comprising:

selecting a field corresponding to at least a portion of the surface of the microelectronic substrate;

selecting a target fraction of the field;

selecting a target time associated with the target fraction;

directing a valve to open to initiate a flow of liquid photoresist along a fluid path toward a surface of the microelectronic substrate while generating a video image of the field;

with reference to the video image, determining an elapsed time between a selected point in time and a point at which the target fraction of the field is covered with photoresist;

determining an error value between the elapsed time and the target time; and adjusting a speed with which the valve opens when the error value exceeds a target error value.

68. The method of claim 67, further comprising selecting the selected point in time to be a point at which a signal is transmitted to the valve to cause the valve to open.

69. The method of claim 67 wherein determining an elapsed time, determining an error value, and adjusting a speed are performed automatically by a computer.

70. The method of claim 67 wherein determining an elapsed time and determining an error value are performed by a computer, and wherein adjusting a speed is performed manually.

* * * * *

UNITED STATES PATENT AND TRADEMARK OFFICE
CERTIFICATE OF CORRECTION

PATENT NO. : 6,680,078 B2
DATED : January 20, 2004
INVENTOR(S) : John T. Davlin et al.

It is certified that error appears in the above-identified patent and that said Letters Patent is hereby corrected as shown below:

<u>Column 12,</u>
Line 13, insert -- is a first -- between "substrate" and "microelectronic".

Signed and Sealed this

Fifteenth Day of June, 2004

JON W. DUDAS
*Acting Director of the United States Patent and Trademark Office*